United States Patent
Lu et al.

(10) Patent No.: US 11,592,929 B2
(45) Date of Patent: *Feb. 28, 2023

(54) TOUCH SENSOR PANEL INCLUDING RESISTORS FOR IMPROVED INPUT SIGNAL

(71) Applicant: Apple Inc., Cupertino, CA (US)

(72) Inventors: Zhou Lu, Santa Clara, CA (US); Isaac Wing-Tak Chan, Sunnyvale, CA (US); Justin Zachary Wu, Cupertino, CA (US); Rangarajan Krishnan, Santa Clara, CA (US); Qingbo Guo, Sunnyvale, CA (US); Chao Zhang, Campbell, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/582,954

(22) Filed: Jan. 24, 2022

(65) Prior Publication Data

US 2022/0147217 A1    May 12, 2022

Related U.S. Application Data

(63) Continuation of application No. 16/994,515, filed on Aug. 14, 2020, now Pat. No. 11,231,807.

(51) Int. Cl.
*G06F 3/041* (2006.01)
*G06F 3/044* (2006.01)

(52) U.S. Cl.
CPC ........ *G06F 3/04164* (2019.05); *G06F 3/0412* (2013.01); *G06F 3/0446* (2019.05)

(58) Field of Classification Search
CPC ..... H01L 28/20; H01L 33/62; H01L 27/0802; H01L 51/5203; G06F 3/04164
See application file for complete search history.

(56) References Cited

U.S. PATENT DOCUMENTS

| 10,372,280 B2 | 8/2019 | Yamai et al. |
| 11,231,807 B1 | 1/2022 | Lu et al. |

(Continued)

FOREIGN PATENT DOCUMENTS

JP    2015-210794 A    11/2015

OTHER PUBLICATIONS

Non-Final Office Action received for U.S. Appl. No. 16/994,515, dated Jul. 6, 2021, 23 pages.

(Continued)

*Primary Examiner* — Sanjiv D. Patel
(74) *Attorney, Agent, or Firm* — Kubota & Basol LLP

(57) ABSTRACT

In some examples, a touch screen includes resistors between the touch electrodes and routing traces. In some examples, the resistors can include a transparent conductive material included in the touch electrodes of the touch screen. The resistors can be located in a border region of the touch screen that can surround an active area of the touch screen that can include the touch electrodes and display pixels of the touch screen, for example. In some examples, the resistors included in the touch screen can have different resistances from each other and the same outer dimensions as one another. The resistors can reduce the variation in resistance from channel to channel in the touch screen, which can improve touch screen performance, for example.

20 Claims, 10 Drawing Sheets

(56) References Cited

U.S. PATENT DOCUMENTS

| | | | |
|---|---|---|---|
| 2008/0252608 A1* | 10/2008 | Geaghan | G06F 3/0446 345/173 |
| 2008/0309623 A1 | 12/2008 | Hotelling et al. | |
| 2010/0059294 A1 | 3/2010 | Elias et al. | |
| 2013/0100039 A1 | 4/2013 | Hong et al. | |
| 2016/0147330 A1 | 5/2016 | Bai et al. | |
| 2016/0170537 A1 | 6/2016 | Chen et al. | |
| 2016/0313825 A1* | 10/2016 | Hotelling | G06F 3/0446 |
| 2019/0339816 A1 | 11/2019 | Hsu et al. | |
| 2020/0174604 A1 | 6/2020 | Zhang | |
| 2022/0050571 A1 | 2/2022 | Lu et al. | |

OTHER PUBLICATIONS

Notice of Allowance received for U.S. Appl. No. 16/994,515, dated Sep. 15, 2021, 8 pages.

\* cited by examiner

TOUCH SENSOR PANEL INCLUDING RESISTORS FOR IMPROVED INPUT SIGNAL

CROSS-REFERENCE TO RELATED APPLICATIONS

This application is a continuation of U.S. application Ser. No. 16/994,515, filed Aug. 14, 2020, the content of which is incorporated herein by reference in its entirety for all purposes.

FIELD OF THE DISCLOSURE

This relates generally to a touch screen and, more specifically, to a touch screen that includes resistors between the touch electrodes and routing traces.

BACKGROUND OF THE DISCLOSURE

Many types of input devices are presently available for performing operations in a computing system, such as buttons or keys, mice, trackballs, joysticks, touch sensor panels, touch screens and the like. Touch screens, in particular, are popular because of their ease and versatility of operation as well as their declining price. Touch screens can include a touch sensor panel, which can be a clear panel with a touch-sensitive surface, and a display device such as a liquid crystal display (LCD), light emitting diode (LED) display or organic light emitting diode (OLED) display that can be positioned partially or fully behind the panel so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing electrical fields used to detect touch can extend beyond the surface of the display, and objects approaching near the surface may be detected near the surface without actually touching the surface.

Capacitive touch sensor panels can be formed by a matrix of transparent, semi-transparent or non-transparent conductive plates made of materials such as Indium Tin Oxide (ITO). In some examples, the conductive plates can be formed from other materials including conductive polymers, metal mesh, graphene, nanowires (e.g., silver nanowires) or nanotubes (e.g., carbon nanotubes). In some implementations, due in part to their substantial transparency, some capacitive touch sensor panels can be overlaid on a display to form a touch screen, as described above. Some touch screens can be formed by at least partially integrating touch sensing circuitry into a display pixel stackup (i.e., the stacked material layers forming the display pixels).

In some examples, touch electrodes can be coupled to touch circuitry by conductive traces. The conductive traces included in the touch sensor panels can have different lengths and, thus, different resistances, in some examples. In some examples, the resistances of the conductive traces can impact the touch signals sensed at the touch sensor panels. For example, variations in resistance of the conductive traces can cause errors in touch sensing that, in turn, can cause errors in locating a proximate object, determining whether a proximate object is touching or hovering over the surface of the touch sensor panel, and/or errors in tracking the movement of an object while it is in contact with the surface of the touch sensor panel.

BRIEF SUMMARY OF THE DISCLOSURE

This relates generally to a touch screen and, more specifically, to a touch screen that includes resistors between the touch electrodes and routing traces. In some examples, routing traces can have different lengths and, therefore, different resistances from one another. Including resistors coupled between the routing traces and touch electrodes can reduce the differences in resistance of each channel, for example. In some examples, reducing the differences in resistance of each channel can improve detecting of an input device. For example, reducing the differences in resistance of each channel can equalize the threshold to which touch data is compared to determine whether the input device is in contact with the touch screen or not and improve the accuracy with which the location of the input device is detected and reduce phantom "wobble" in the detected location of the input device caused by inaccuracies in locating the input device.

In some examples, the resistors can include a transparent conductive material included in the touch electrodes of the touch screen. The resistors can be located in a border region of the touch screen that can surround an active area of the touch screen that can include the touch electrodes and display pixels of the touch screen, for example. In some examples, the resistors included in the touch screen can have different resistances from each other and the same outer dimensions as one another. For example, the resistors can include holes surrounded by the conductive material of the resistors. In some examples, different resistors can have different sized holes and the same outer dimensions.

DETAILED DESCRIPTION OF THE DISCLOSURE

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

This relates generally to a touch screen and, more specifically, to a touch screen that includes resistors between the touch electrodes and routing traces. In some examples, routing traces can have different lengths and, therefore, different resistances from one another. Including resistors coupled between the routing traces and touch electrodes can reduce the differences in resistance of each channel, for example. In some examples, reducing the differences in resistance of each channel can improve detecting of an input device. For example, reducing the differences in resistance of each channel can equalize the threshold to which touch data is compared to determine whether the input device is in contact with the touch screen or not and improve the accuracy with which the location of the input device is detected and reduce phantom "wobble" in the detected location of the input device caused by inaccuracies in locating the input device.

In some examples, the resistors can include a transparent conductive material included in the touch electrodes of the touch screen. The resistors can be located in a border region of the touch screen that can surround an active area of the touch screen that can include the touch electrodes and display pixels of the touch screen, for example. In some examples, the resistors included in the touch screen can have different resistances from each other and the same outer dimensions as one another. For example, the resistors can include holes surrounded by the conductive material of the resistors. In some examples, different resistors can have different sized holes and the same outer dimensions.

Figure 1A:
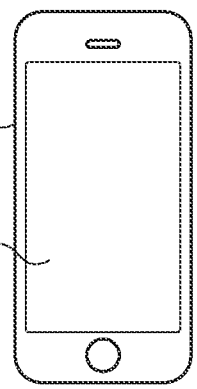
FIGS. 1A-1E illustrate example systems that can use resistance techniques according to examples of the disclosure.
Figure 1B:
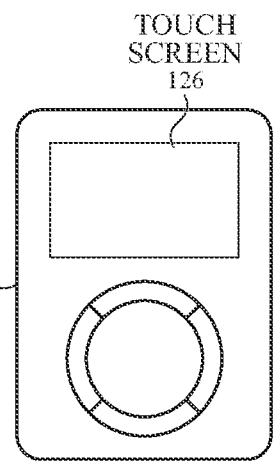
Figure 1C:
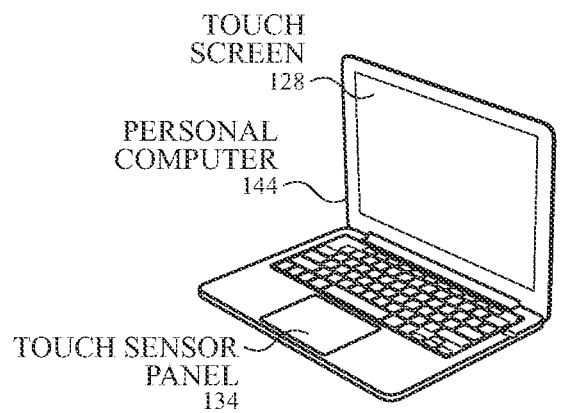
Figure 1D:
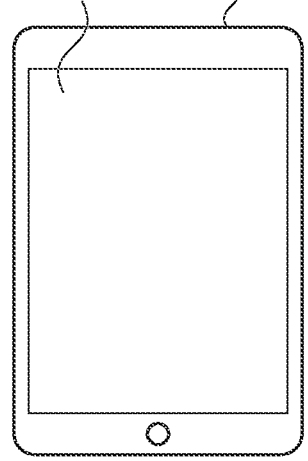
Figure 1E:
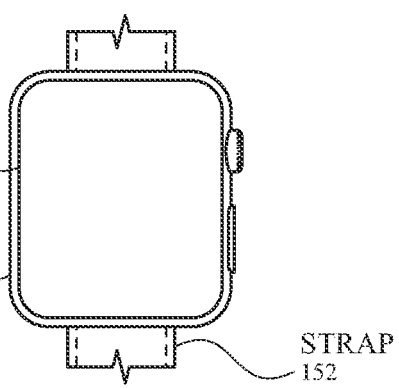

FIGS. 1A-1E illustrate example systems that can use resistance techniques according to examples of the disclosure. FIG. 1A illustrates an example mobile telephone 136 that includes a touch screen 124 that can use resistance techniques according to examples of the disclosure. FIG. 1B illustrates an example digital media player 140 that includes a touch screen 126 that can use resistance techniques according to examples of the disclosure. FIG. 1C illustrates an example personal computer 144 that includes a touch screen 128 and a touch sensor panel 134 (e.g., a trackpad) that can use resistance techniques according to examples of the disclosure. FIG. 1D illustrates an example tablet computing device 148 that includes a touch screen 130 that can use resistance techniques according to examples of the disclosure. FIG. 1E illustrates an example wearable device 150 that includes a touch screen 132 and can be attached to a user using a strap 152 and that can use resistance techniques according to examples of the disclosure. It is understood that a touch screen and resistance techniques can be implemented in other devices, including future devices not yet in the marketplace. Additionally, it should be understood that although the disclosure herein primarily focuses on touch screens, the disclosure of noise removal techniques can be implemented for devices including touch sensor panels (and displays) that may not be implemented as a touch screen.

In some examples, touch screens 124, 126, 128, 130 and 132 and touch sensor panels 134 and 138 can be based on self-capacitance. A self-capacitance based touch system can include a matrix of small, individual plates of conductive material or groups of individual plates of conductive material forming larger conductive regions that can be referred to as touch electrodes or as touch node electrodes (as described below with reference to FIG. 4B). For example, a touch screen can include a plurality of individual touch electrodes, each touch electrode identifying or representing a unique location (e.g., a touch node) on the touch screen at which touch or proximity is to be sensed, and each touch node electrode being electrically isolated from the other touch node electrodes in the touch screen/panel. Such a touch screen can be referred to as a pixelated self-capacitance touch screen, though it is understood that in some examples, the touch node electrodes on the touch screen can be used to perform scans other than self-capacitance scans on the touch screen (e.g., mutual capacitance scans). During operation, a touch node electrode can be stimulated with an alternating current (AC) waveform, and the self-capacitance to ground of the touch node electrode can be measured. As an object approaches the touch node electrode, the self-capacitance to ground of the touch node electrode can change (e.g., increase). This change in the self-capacitance of the touch node electrode can be detected and measured by the touch sensing system to determine the positions of multiple objects when they touch, or come in proximity to, the touch screen. In some examples, the touch node electrodes of a self-capacitance based touch system can be formed from rows and columns of conductive material, and changes in the self-capacitance to ground of the rows and columns can be detected, similar to above. In some examples, a touch screen can be multi-touch, single touch, projection scan, full-imaging multi-touch, capacitive touch, etc.

In some examples, touch screens 124, 126, 128, 130 and 132 and touch sensor panels 134 and 138 can be based on mutual capacitance. A mutual capacitance based touch system can include electrodes arranged as drive and sense lines (e.g., as described below with reference to FIG. 4A) that may cross over each other on different layers (in a double-sided configuration) or may be adjacent to each other on the same layer. The crossing or adjacent locations can form touch nodes. During operation, the drive line can be stimulated with an AC waveform and the mutual capacitance of the touch node can be measured. As an object approaches the touch node, the mutual capacitance of the touch node can change (e.g., decrease). This change in the mutual capacitance of the touch node can be detected and measured by the touch sensing system to determine the positions of multiple objects when they touch, or come in proximity to, the touch screen. As described herein, in some examples, a mutual capacitance based touch system can form touch nodes from a matrix of small, individual plates of conductive material.

In some examples, touch screens 124, 126, 128, 130 and 132 and touch sensor panels 134 and 138 can be based on mutual capacitance and/or self-capacitance. The electrodes can be arrange as a matrix of small, individual plates of conductive material (e.g., as in touch node electrodes 408 in touch screen 402 in FIG. 4B) or as drive lines and sense lines (e.g., as in row touch electrodes 404 and column touch electrodes 406 in touch screen 400 in FIG. 4A), or in another pattern. The electrodes can be configurable for mutual capacitance or self-capacitance sensing or a combination of mutual and self-capacitance sensing. For example, in one mode of operation electrodes can be configured to sense mutual capacitance between electrodes and in a different mode of operation electrodes can be configured to sense self-capacitance of electrodes. In some examples, some of the electrodes can be configured to sense mutual capacitance there between and some of the electrodes can be configured to sense self-capacitance thereof.

Figure 2:
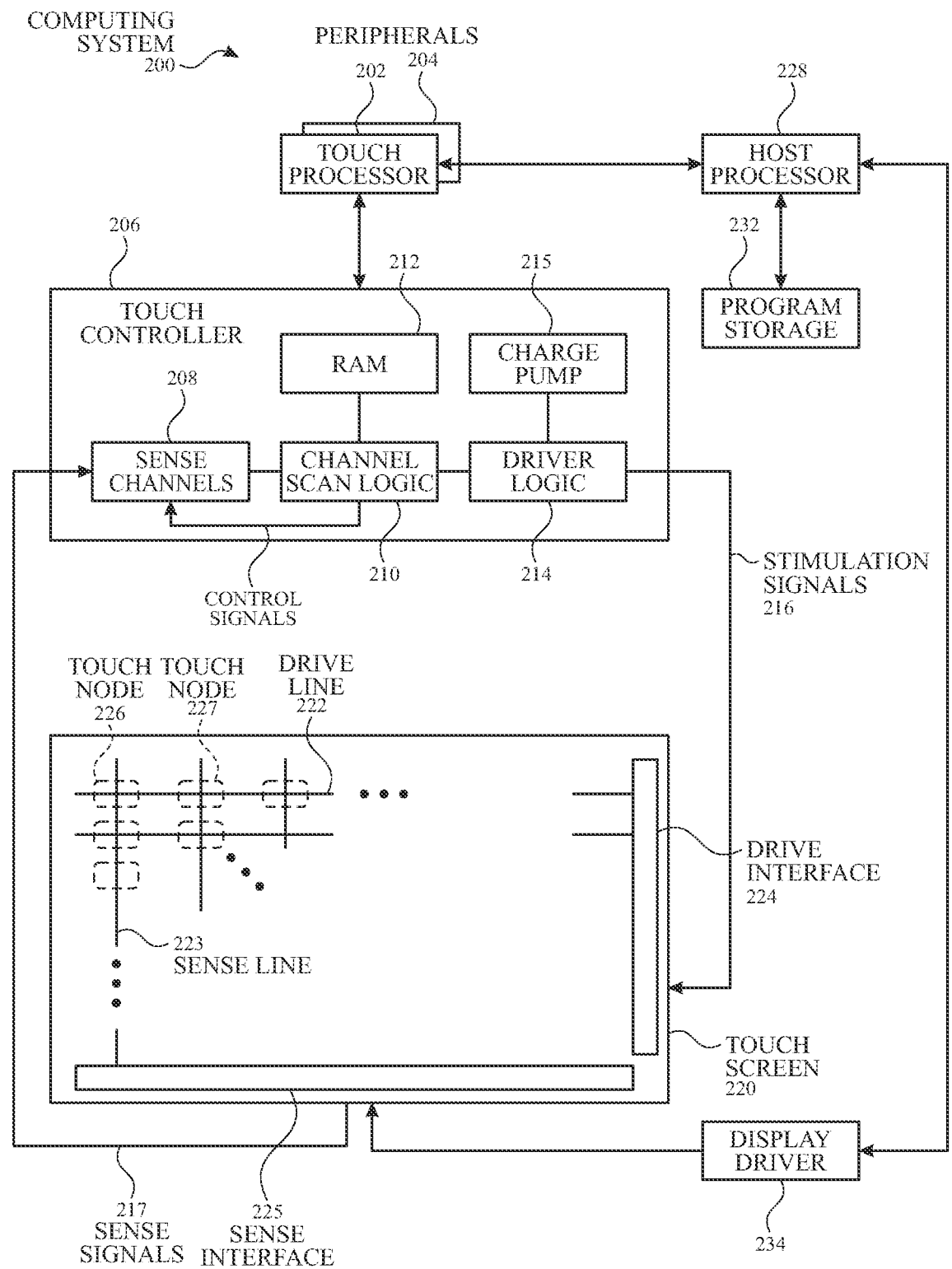
FIG. 2 illustrates an example computing system including a touch screen that can use resistance techniques according to examples of the disclosure.

FIG. 2 illustrates an example computing system including a touch screen that can use noise removal techniques according to examples of the disclosure. Computing system 200 can be included in, for example, a mobile phone, tablet, touchpad, portable or desktop computer, portable media player, wearable device or any mobile or non-mobile computing device that includes a touch screen or touch sensor panel. Computing system 200 can include a touch sensing system including one or more touch processors 202, peripherals 204, a touch controller 206, and touch sensing circuitry (described in more detail below). Peripherals 204 can include, but are not limited to, random access memory (RAM) or other types of memory or storage, watchdog timers, co-processor(s) and the like. Touch controller 206 can include, but is not limited to, one or more sense channels 208, channel scan logic 210 and driver logic 214. Channel scan logic 210 can access RAM 212, autonomously read data from the sense channels and provide control for the sense channels. In addition, channel scan logic 210 can control driver logic 214 to generate stimulation signals 216 at various frequencies and/or phases that can be selectively applied to drive regions of the touch sensing circuitry of touch screen 220, as described in more detail below. In some examples, touch controller 206, touch processor 202 and peripherals 204 can be integrated into a single application specific integrated circuit (ASIC), and in some examples can be integrated with touch screen 220 itself.

It should be apparent that the architecture shown in FIG. 2 is only one example architecture of computing system 200, and that the system could have more or fewer components than shown, or a different configuration of components. The various components shown in FIG. 2 can be implemented in hardware, software, firmware or any combination thereof, including one or more signal processing and/or application specific integrated circuits.

Computing system 200 can include a host processor 228 for receiving outputs from touch processor 202 and performing actions based on the outputs. For example, host processor 228 can be connected to program storage 232 and a display controller/driver 234 (e.g., a Liquid-Crystal Display (LCD) driver). It is understood that although some examples of the disclosure may described with reference to LCD displays, the scope of the disclosure is not so limited and can extend to other types of displays, such as Light-Emitting Diode (LED) displays, including Organic LED (OLED), Active-Matrix Organic LED (AMOLED) and Passive-Matrix Organic LED (PMOLED) displays. Display driver 234 can provide voltages on select (e.g., gate) lines to each pixel transistor and can provide data signals along data lines to these same transistors to control the pixel display image.

Host processor 228 can use display driver 234 to generate a display image on touch screen 220, such as a display image of a user interface (UI), and can use touch processor 202 and touch controller 206 to detect a touch on or near touch screen 220, such as a touch input to the displayed UI. The touch input can be used by computer programs stored in program storage 232 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, capturing an image with a camera in communication with the electronic device, exiting an idle/sleep state of the electronic device, and/or the like. Host processor 228 can also perform additional functions that may not be related to touch processing.

Note that one or more of the functions described herein, including the configuration of switches, can be performed by firmware stored in memory (e.g., one of the peripherals 204 in FIG. 2) and executed by touch processor 202, or stored in program storage 232 and executed by host processor 228. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding signals) that can contain or store the program for use by or in connection with the instruction execution system, apparatus, or device. In some examples, RAM 212 or program storage 232 (or both) can be a non-transitory computer readable storage medium. One or both of RAM 212 and program storage 232 can have stored therein instructions, which when executed by touch processor 202 or host processor 228 or both, can cause the device including computing system 200 to perform one or more functions and methods of one or more examples of this disclosure. The computer-readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

Touch screen 220 can be used to derive touch information at multiple discrete locations of the touch screen, referred to herein as touch nodes. Touch screen 220 can include touch sensing circuitry that can include a capacitive sensing medium having a plurality of drive lines 222 and a plurality of sense lines 223. It should be noted that the term "lines" is sometimes used herein to mean simply conductive pathways, as one skilled in the art will readily understand, and is not limited to elements that are strictly linear, but includes pathways that change direction, and includes pathways of different size, shape, materials, etc. Drive lines 222 can be driven by stimulation signals 216 from driver logic 214 through a drive interface 224 and resulting sense signals 217 generated in sense lines 223 can be transmitted through a sense interface 225 to sense channels 208 in touch controller 206. In this way, drive lines and sense lines can be part of the touch sensing circuitry that can interact to form capacitive sensing nodes, which can be thought of as touch picture elements (touch pixels) and referred to herein as touch nodes, such as touch nodes 226 and 227. This way of understanding can be particularly useful when touch screen 220 is viewed as capturing an "image" of touch ("touch image"). In other words, after touch controller 206 has determined whether a touch has been detected at each touch nodes in the touch screen, the pattern of touch nodes in the touch screen at which a touch occurred can be thought of as an "image" of touch (e.g., a pattern of fingers touching the touch screen). As used herein, an electrical component "coupled to" or "connected to" another electrical component encompasses a direct or indirect connection providing electrical path for communication or operation between the coupled components. Thus, for example, drive lines 222 may be directly connected to driver logic 214 or indirectly connected to drive logic 214 via drive interface 224 and sense lines 223 may be directly connected to sense channels 208 or indirectly connected to sense channels 208 via sense interface 225. In either case an electrical path for driving and/or sensing the touch nodes can be provided.

Figure 3A:
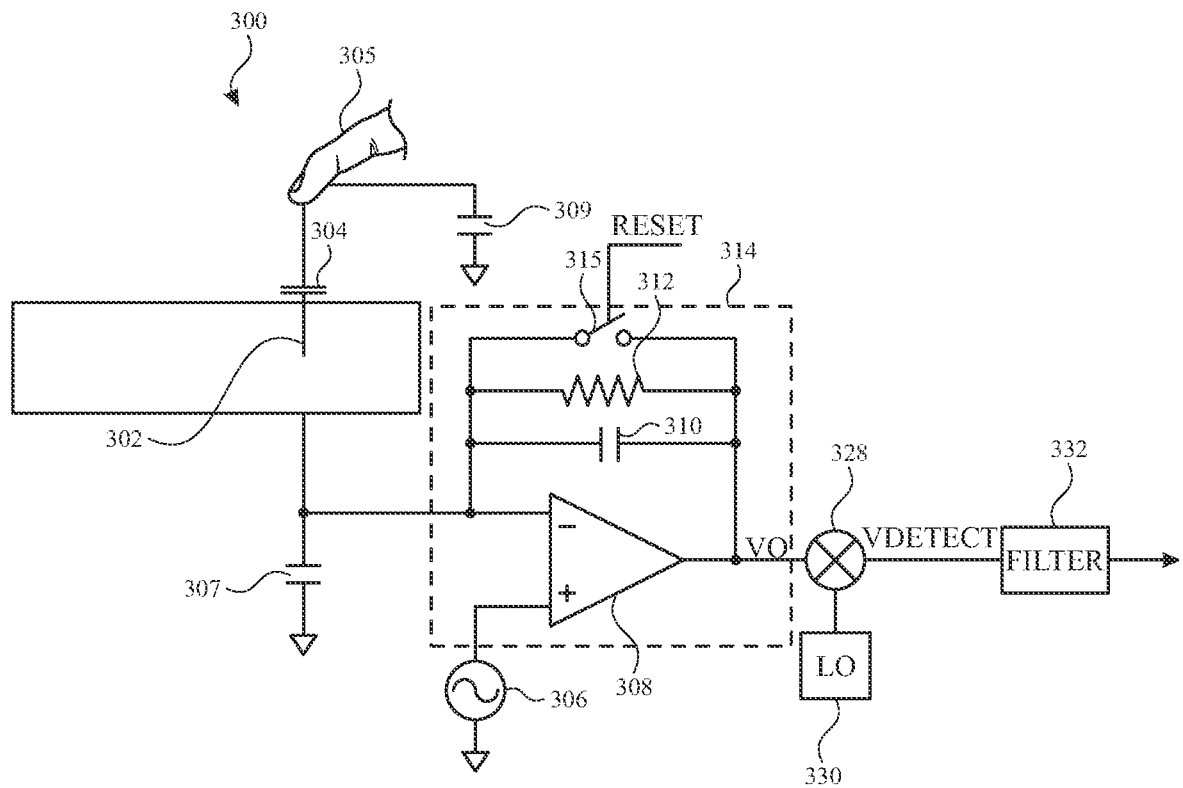
FIG. 3A illustrates an exemplary touch sensor circuit corresponding to a self-capacitance measurement of a touch node electrode and sensing circuit according to examples of the disclosure.

FIG. 3A illustrates an exemplary touch sensor circuit 300 corresponding to a self-capacitance measurement of a touch node electrode 302 and sensing circuit 314 (e.g., corresponding to a sense channel 208) according to examples of the disclosure. Touch node electrode 302 can correspond to a touch electrode 404 or 406 of touch screen 400 or a touch node electrode 408 of touch screen 402. Touch node electrode 302 can have an inherent self-capacitance to ground associated with it, and also an additional self-capacitance to ground that is formed when an object, such as finger 305, is in proximity to or touching the electrode. The total self-capacitance to ground of touch node electrode 302 can be illustrated as capacitance 304. Touch node electrode 302 can be coupled to sensing circuit 314. Sensing circuit 314 can include an operational amplifier 308, feedback resistor 312 and feedback capacitor 310, although other configurations can be employed. For example, feedback resistor 312 can be replaced by a switched capacitor resistor in order to minimize a parasitic capacitance effect that can be caused by a variable feedback resistor. Touch node electrode 302 can be coupled to the inverting input (−) of operational amplifier 308. An AC voltage source 306 (Vac) can be coupled to the non-inverting input (+) of operational amplifier 308. Touch sensor circuit 300 can be configured to sense changes (e.g., increases) in the total self-capacitance 304 of the touch node electrode 302 induced by a finger or object either touching or in proximity to the touch sensor panel. Output 320 can be used by a processor to determine the presence of a proximity or touch event, or the output can be inputted into a discreet logic network to determine the presence of a proximity or touch event.

Figure 3B:
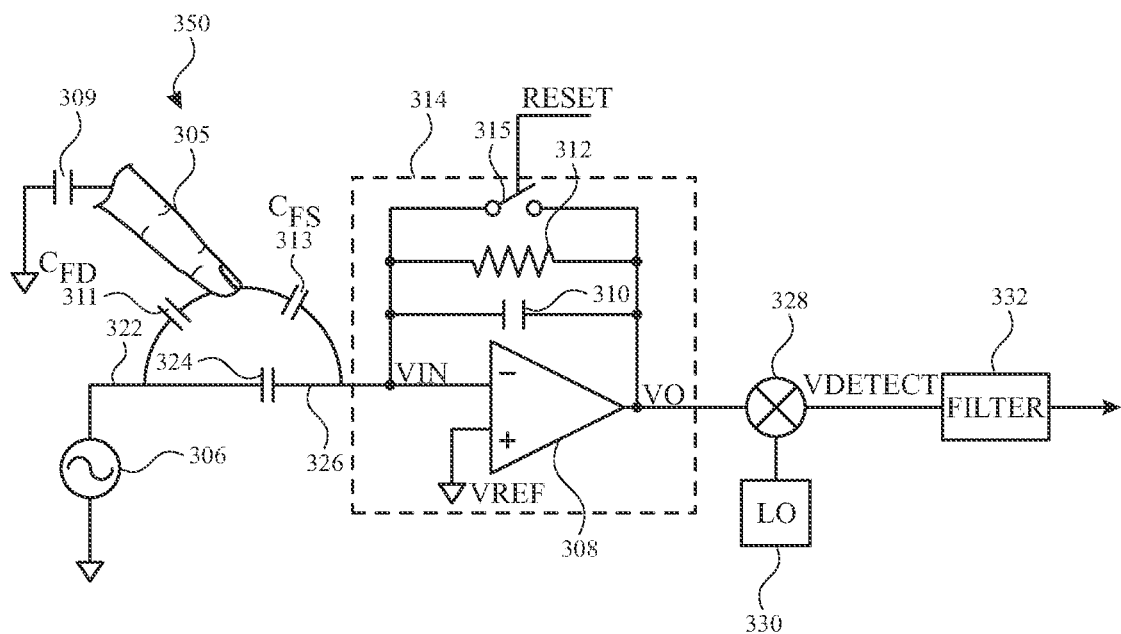
FIG. 3B illustrates an exemplary touch sensor circuit corresponding to a mutual-capacitance drive line and sense line and sensing circuit according to examples of the disclosure.

FIG. 3B illustrates an exemplary touch sensor circuit 350 corresponding to a mutual-capacitance drive line 322 and sense line 326 and sensing circuit 314 (e.g., corresponding to a sense channel 208) according to examples of the disclosure. Drive line 322 can be stimulated by stimulation signal 306 (e.g., an AC voltage signal). Stimulation signal 306 can be capacitively coupled to sense line 326 through mutual capacitance 324 between drive line 322 and the sense line. When a finger or object 305 approaches the touch node created by the intersection of drive line 322 and sense line 326, mutual capacitance 324 can change (e.g., decrease). This change in mutual capacitance 324 can be detected to indicate a touch or proximity event at the touch node, as described herein. The sense signal coupled onto sense line 326 can be received by sensing circuit 314. Sensing circuit 314 can include operational amplifier 308 and at least one of a feedback resistor 312 and a feedback capacitor 310. FIG. 3B illustrates a general case in which both resistive and capacitive feedback elements are utilized. The sense signal (referred to as $V_{in}$) can be inputted into the inverting input of operational amplifier 308, and the non-inverting input of the operational amplifier can be coupled to a reference voltage $V_{ref}$. Operational amplifier 308 can drive its output to voltage $V_o$ to keep $V_{in}$ substantially equal to $V_{ref}$ and can therefore maintain $V_{in}$ constant or virtually grounded. A person of skill in the art would understand that in this context, equal can include deviations of up to 15%. Therefore, the gain of sensing circuit 314 can be mostly a function of the ratio of mutual capacitance 324 and the feedback impedance, comprised of resistor 312 and/or capacitor 310. The output of sensing circuit 314 Vo can be filtered and heterodyned or homodyned by being fed into multiplier 328, where Vo can be multiplied with local oscillator 330 to produce $V_{detect}$. $V_{detect}$ can be inputted into filter 332. One skilled in the art will recognize that the placement of filter 332 can be varied; thus, the filter can be placed after multiplier 328, as illustrated, or two filters can be employed: one before the multiplier and one after the multiplier. In some examples, there can be no filter at all. The direct current (DC) portion of $V_{detect}$ can be used to determine if a touch or proximity event has occurred.

Referring back to FIG. 2, in some examples, touch screen 220 can be an integrated touch screen in which touch sensing circuit elements of the touch sensing system can be integrated into the display pixel stack-ups of a display. The circuit elements in touch screen 220 can include, for example, elements that can exist in LCD or other displays (LED display, OLED display, etc.), such as one or more pixel transistors (e.g., thin film transistors (TFTs)), gate lines, data lines, pixel electrodes and common electrodes. In a given display pixel, a voltage between a pixel electrode and a common electrode can control a luminance of the display pixel. The voltage on the pixel electrode can be supplied by a data line through a pixel transistor, which can be controlled by a gate line. It is noted that circuit elements are not limited to whole circuit components, such as a whole capacitor, a whole transistor, etc., but can include portions of circuitry, such as only one of the two plates of a parallel plate capacitor.

Figure 4B:
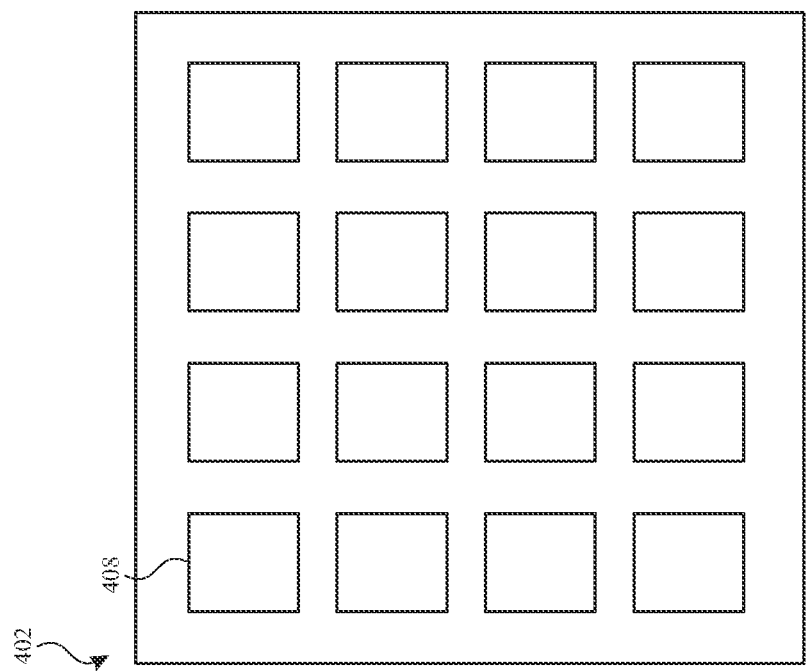
FIG. 4B illustrates touch screen with touch node electrodes arranged in a pixelated touch node electrode configuration according to examples of the disclosure.
Figure 4A:
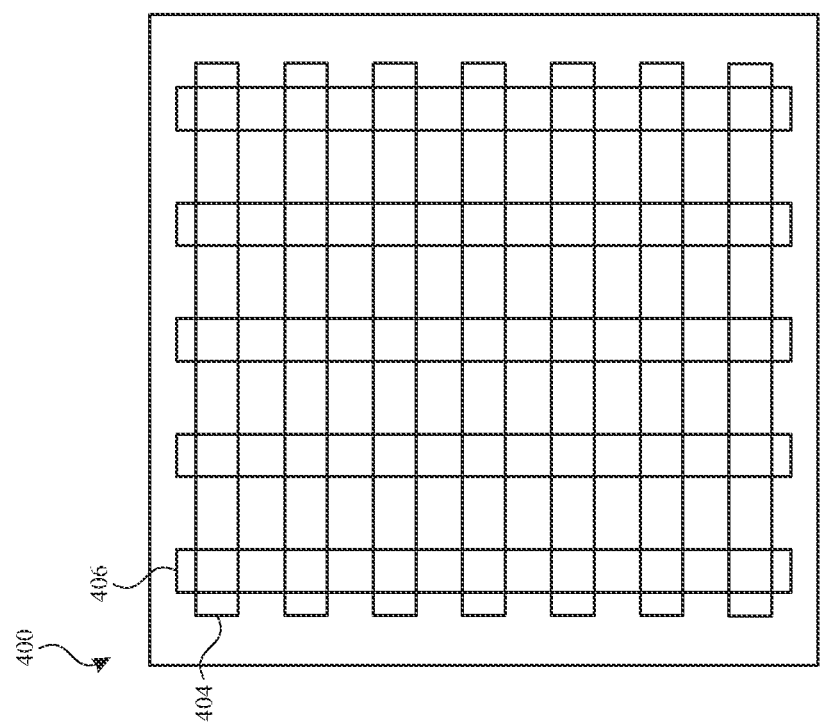
FIG. 4A illustrates touch screen with touch electrodes arranged in rows and columns according to examples of the disclosure.

FIG. 4A illustrates touch screen 400 with touch electrodes 404 and 406 arranged in rows and columns according to examples of the disclosure. Specifically, touch screen 400 can include a plurality of touch electrodes 404 disposed as rows, and a plurality of touch electrodes 406 disposed as columns. Touch electrodes 404 and touch electrodes 406 can be on the same or different material layers on touch screen 400, and can intersect with each other, as illustrated in FIG. 4A. In some examples, the electrodes can be formed on opposite sides of a transparent (partially or fully) substrate and from a transparent (partially or fully) semiconductor material, such as ITO, though other materials are possible. Electrodes displayed on layers on different sides of the substrate can be referred to herein as a double-sided sensor. In some examples, touch screen 400 can sense the self-capacitance of touch electrodes 404 and 406 to detect touch and/or proximity activity on touch screen 400, and in some examples, touch screen 400 can sense the mutual capacitance between touch electrodes 404 and 406 to detect touch and/or proximity activity on touch screen 400. Although the touch electrodes 404 and 406 are illustrated as being rectangular-shaped, it should be understood that other electrode shapes and structures (e.g., diamond-, square-, stripe- or circle-shaped electrodes connected by jumpers or vias) are possible.

FIG. 4B illustrates touch screen 402 with touch node electrodes 408 arranged in a pixelated touch node electrode configuration according to examples of the disclosure. Specifically, touch screen 402 can include a plurality of individual touch node electrodes 408, each touch node electrode identifying or representing a unique location on the touch screen at which touch or proximity (i.e., a touch or proximity event) is to be sensed, and each touch node electrode being electrically isolated from the other touch node electrodes in the touch screen/panel, as previously described. Touch node electrodes 408 can be on the same or different material layers on touch screen 402. In some examples, touch screen 402 can sense the self-capacitance of touch node electrodes 408 to detect touch and/or proximity activity on touch screen 402, and in some examples, touch screen 402 can sense the mutual capacitance between touch node electrodes 408 to detect touch and/or proximity activity on touch screen 402. Although touch node electrodes 408 are illustrated as having rectangular shapes, it should be understood that other electrode shapes (e.g., diamonds, circles, stripes etc.) and structures are possible.

In some examples, the touch electrodes of a touch screen can be coupled to touch circuitry (e.g., drive circuitry, sense circuitry, etc.) via conductive traces. The conductive traces can connect the touch electrodes to a bond pad region and other connections can be used to connect the bond pad region to the touch circuitry, for example. In some examples, the touch electrodes can include a transparent conductive material, such as ITO, AZO, etc. and the conductive traces can include an opaque conductor such as copper, silver, gold, etc. In some examples, the opaque conductor can have a lower sheet resistance than the transparent conductor. The resistance of the opaque conductive traces can still be non-negligible in some examples. For example, differences in lengths of the conductive traces can result in differences in resistances along the conductive traces.

In some examples, differences in the resistance of the conductive traces coupling the touch electrodes to the sense circuitry can cause inconsistencies in the touch signals detected at different electrodes of the touch screen and reduce the accuracy with which touch is detected and located. For example, inconsistencies in resistance can cause the touch screen to less readily detect that an input device or other object is touching the touch sensor panel in some regions of the touch sensor panel than in other regions of the touch sensor panel. As another example, inconsistencies in the resistance can cause errors in detecting the location of the proximate object. In some examples, while a user is writing or drawing using an input device (e.g., stylus) or their finger, errors in the determination of the location of the input device or finger can cause the electronic device to display the drawing in a way that does not correspond to the movement performed by the user. For example, the user can draw a substantially straight line with a stylus or their finger but, due to inconsistencies in the resistances of the sense connections of the touch sensor panel, the electronic device can incorrectly identify the movement of the stylus or finger as having curves or angles that do not correspond to the movement performed by the user. In other words, in some examples, the lines, drawings, and/or writings input by the user can "wobble" although the movement performed by the user was smooth.

Figure 5:
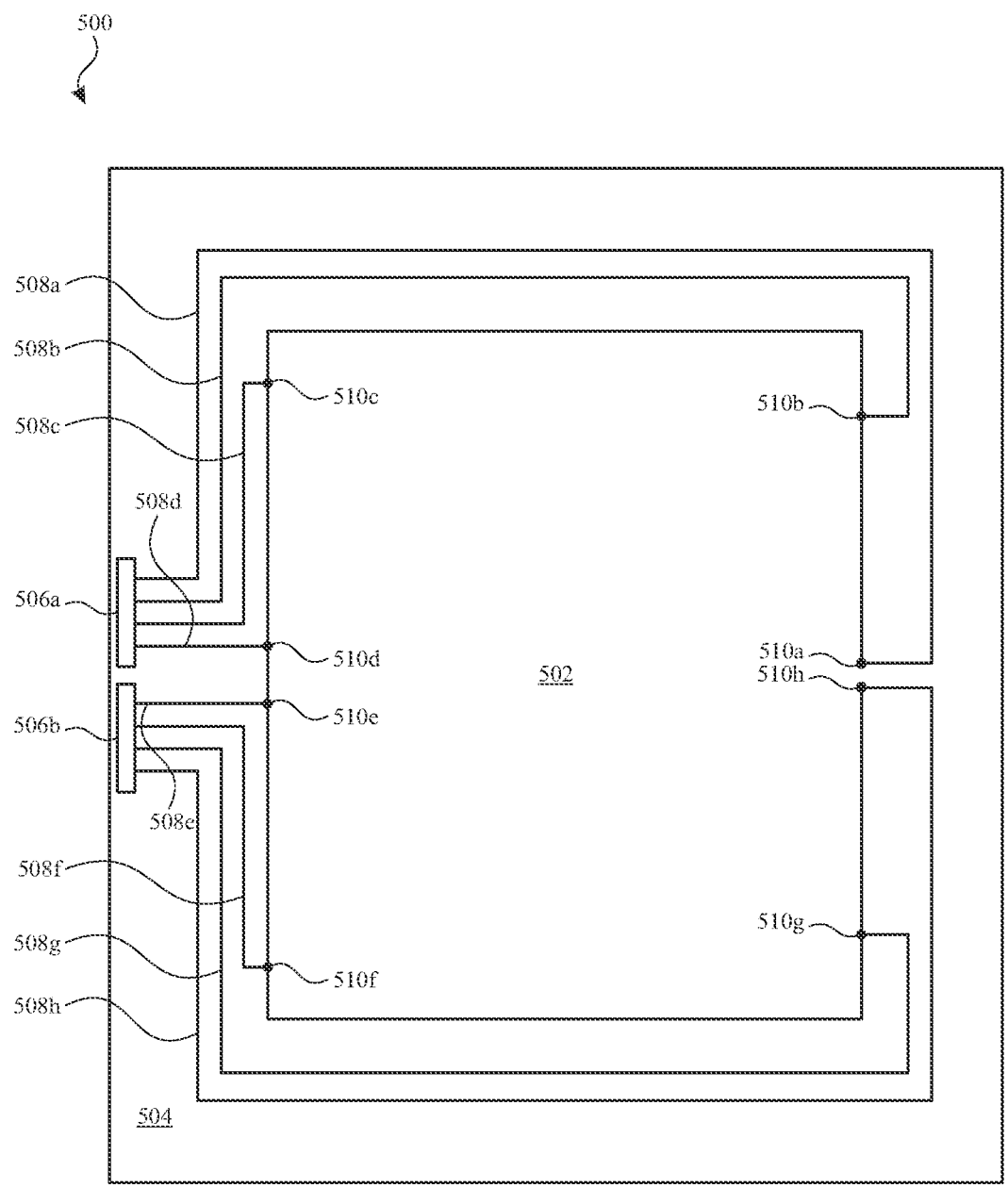
FIG. 5 illustrates an exemplary touch screen according to some examples of the disclosure.

FIG. 5 illustrates an exemplary touch screen 500 according to some examples of the disclosure. As shown in FIG. 5, in some examples, the touch screen 500 can include an active area 502 in which the touch electrodes (not shown) can be disposed. The touch electrodes can include a transparent conductive material. In some examples, the touch screen can include display pixels (not shown) in the active area 502. Thus, for example, the touch screen is able to display images and sense touch within active area 502. In some examples, the active area 502 can be at least partially surrounded by a border region 504. The border region 504 can include bond pads 506a and 506b and opaque conductive traces 508a-h, for example. In some examples, the opaque conductive traces 508a-508h can be coupled to the touch electrodes at locations 510a-h near the boundary between the active area 502 and the border region 504. In some examples, once the electronic device including touch screen 500 is fully assembled, the border region 504 can be obscured by an opaque mask and the active area 502 can be covered with a transparent cover material (e.g., glass, plastic, etc.).

In some examples, the lengths of the opaque conductive traces 508a-h can vary from line-to-line in order to reach the various touch electrodes included in the touch sensor panel 500. For example, opaque conductive trace 508a can be longer than opaque conductive trace 508b. Accordingly, in some examples, the resistances of the opaque conductive traces 508a-h can also vary due to the variations in lengths. For example, the resistance of opaque conductive trace 508a can be higher than the resistance of conductive trace 508b. In some examples, variations in the resistances of the opaque conductive traces 508a-h can cause variations in the touch signals sensed by the touch screen 500. These variations can reduce the accuracy of touch detection and the accuracy of estimated locations of objects proximate to and touching the touch screen 500.

Figure 6:
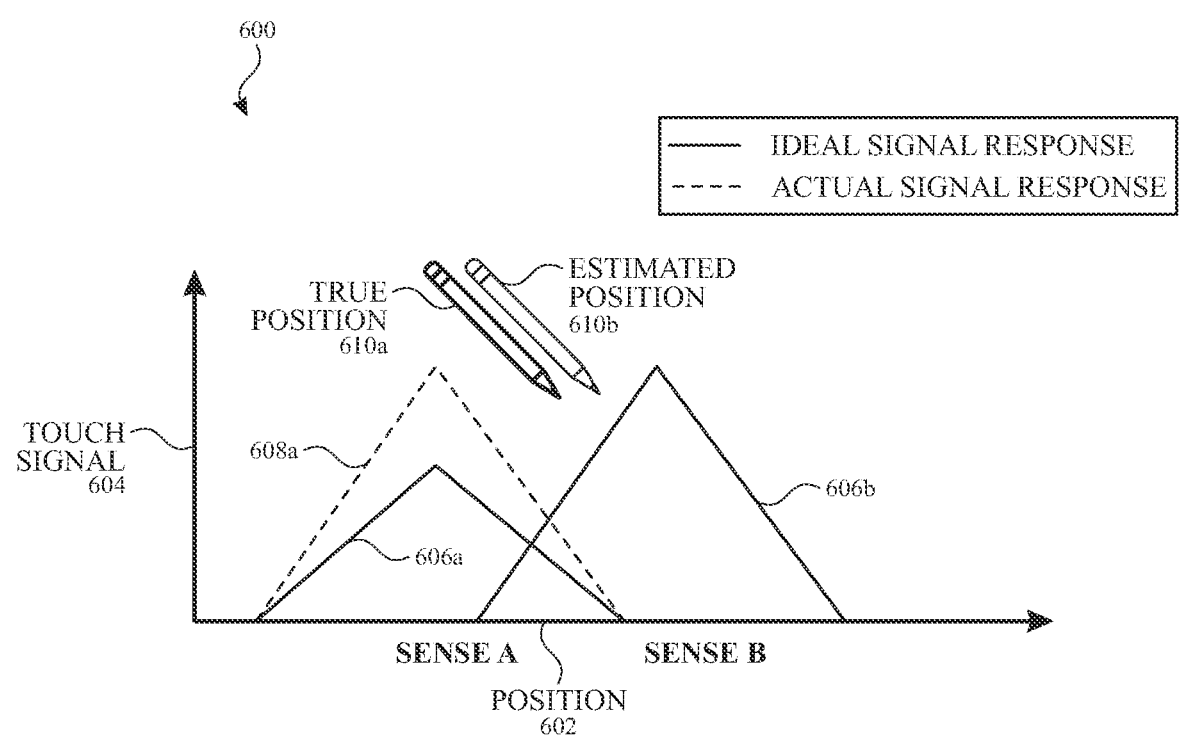
FIG. 6 is a chart illustrating exemplary differences in touch sensing that can be caused by variations in resistances of opaque conductive traces of touch screens according to some examples.

FIG. 6 is a chart 600 illustrating exemplary differences in touch sensing that can be caused by variations in resistances of opaque conductive traces of touch screens according to some examples. The chart 600 indicates the touch signal 604 sensed at the touch electrodes at different positions 602 along one of the dimensions of the touch screen (e.g., the rows or columns). In some examples, a proximate object (e.g., a finger or stylus) can be touching or proximate to the touch screen at a location 610a between two sense electrodes (e.g., Sense A and Sense B). The electronic device including the touch screen can sense touch signals 606a and 606b at both electrodes, in some examples.

In some examples, the resistances of the opaque conductive traces connecting each of the sense electrodes to touch circuitry can be different. For example, the resistance of the opaque conductive trace coupled to Sense A can be higher than the resistance of the opaque conductive trace coupled to Sense B. Therefore, in this example, although the true position 610a of the proximate object can be equally spaced between the touch electrodes, the touch signal 606a sensed from Sense A can have a lower magnitude than the touch signal 606b sensed from Sense B. Thus, in some examples, when the electronic device estimates the position of the proximate object by calculating the centroid of the touch signals 606a and 606b, the estimated position 610b can be closer to Sense B relative to the true position 610a. In some examples, if the user were to draw a line or drawing across the locations of Sense A and Sense B using a digital drawing application using the touch sensor panel and optionally the stylus, errors in the detected location of the stylus could cause the displayed digital drawing to include curves or wobbled portions that deviate from the movement performed by the user, such as by curving closer to Sense B than the movement performed by the user. As another example, the touch screen may not detect the presence of the stylus or another proximate object, such as the user's finger when the proximate object is located at the location of Sense A as readily as the touch screen may detect the presence of the proximate object when the proximate object is located at the location of Sense B.

In some examples, if the difference in resistance between Sense A and Sense B was reduced, negligible, or zero, the responses of Sense A and Sense B while the proximate object is equally spaced between Sense A and Sense B can be equal or substantially equal. For example, if the difference in resistance between Sense A and Sense B was reduced, negligible, or zero, the touch signal 608a sensed at Sense A can be equal or substantially equal to the touch signal 606b sensed at Sense B and the electronic device can more accurately estimate the position 610a of the proximate object. In some examples, reducing the difference in resistance between Sense A and Sense B could reduce the errors in sensing the movement of an object proximate to the touch screen and reduce inconsistencies and errors in determining whether a proximate object is touching or hovering over the surface of the touch screen. In some examples, a touch screen can include resistors along the conductive path from the bond pads to the touch electrodes. For example, resistors with different values can be chosen to reduce the differences in resistance between the conductive paths coupled to adjacent electrodes.

Figure 7:
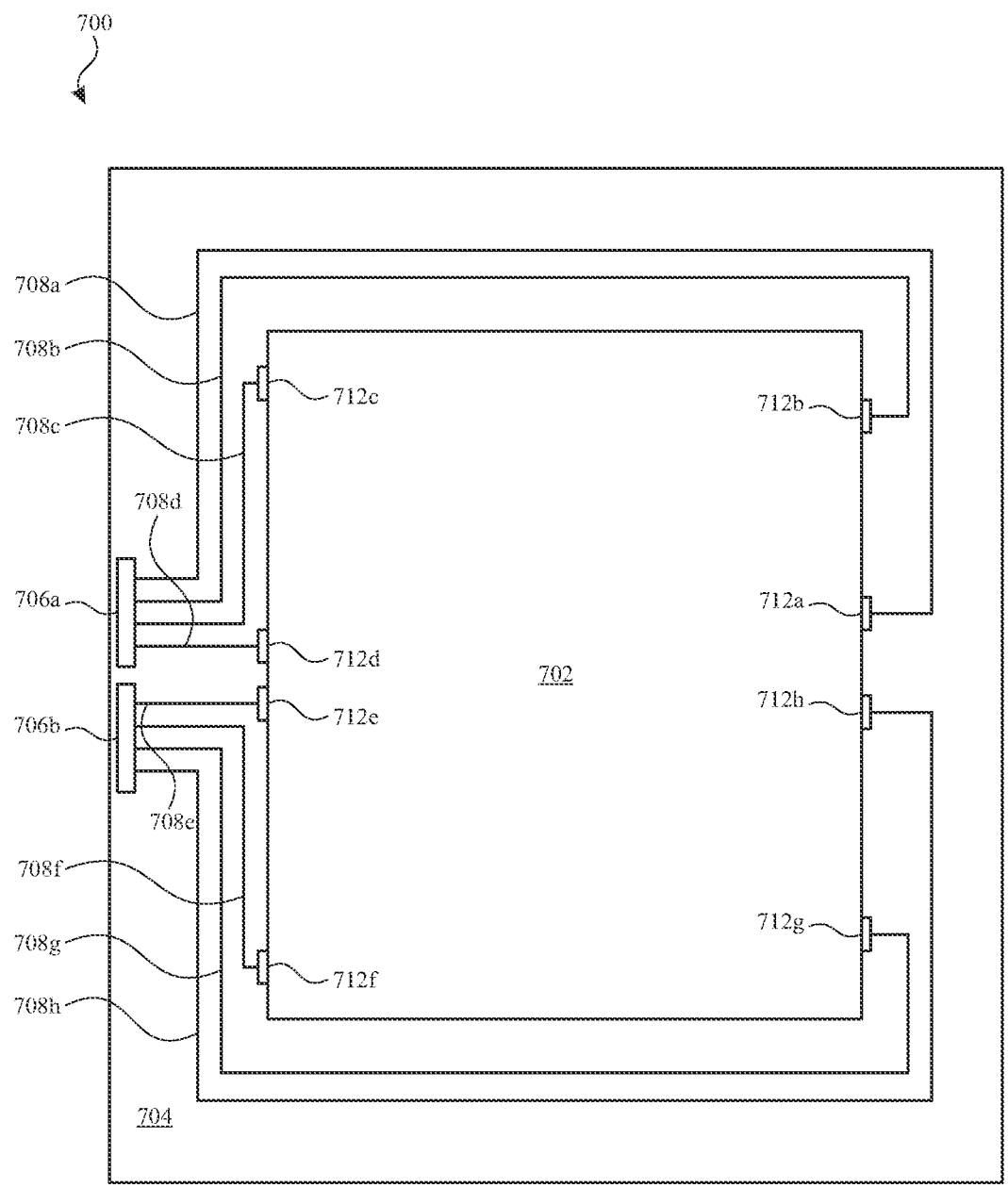
FIG. 7 illustrates an exemplary touch screen including resistors coupled to the opaque conductive traces that connect touch electrodes to the bond pads according to some examples of the disclosure.

FIG. 7 illustrates an exemplary touch screen 700 including resistors coupled to the opaque conductive traces 708a-h that connect touch electrodes to the bond pads 706a-b according to some examples of the disclosure. The touch screen 700 illustrated in FIG. 7 can be similar to the touch screen 500 illustrated in FIG. 5. For example, touch screen 700 can include an active area 702 in which the touch electrodes (not shown) can be disposed. The touch electrodes can include a transparent conductive material. In some examples, the touch screen 700 can include display pixels (not shown) in the active area 702. Thus, for example, the touch screen 700 is able to display images and sense touch within active area 702. In some examples, the active area 702 can be surrounded by a border region 704. The border region 704 can include bond pads 706a and 706b and opaque conductive traces 708a-h, for example. In some examples, the opaque conductive traces 708a-708h can be coupled to the touch electrodes. In some examples, once the electronic device including touch screen 700 is fully assembled, the border region 704 can be obscured by an opaque mask and the active area 702 can be covered with a transparent cover material (e.g., glass, plastic, etc.). In some examples, the transparent cover material covers the active area 702 and covers the opaque mask disposed over the border region 704.

Similarly to touch screen 500, in some examples, the lengths of the opaque conductive traces 708a-h of touch screen 700 can vary from line-to-line in order to reach the various touch electrodes included in the touch sensor panel 700. In order to reduce the variation in total resistance of the conductive path from the bond pads 706a-b to the touch electrodes, touch screen 700 can further include resistors 712a-h, for example. In some examples, the resistances of resistors 712a-h can vary from line to line. For example, the resistor 712a coupled to opaque conductive trace 708a can have a higher resistance than the resistor 712b coupled to opaque conductive trace 708b. Because opaque conductive trace 708a can be longer than opaque conductive trace 708b, the resistance of conductive trace 708a can be higher than the resistance of opaque conductive trace 708b, for example. In some examples, including resistors 712a and 712b as illustrated in FIG. 7, wherein the resistance of resistor 712b is greater than the resistance of resistor 712a, can reduce the difference in total resistance of the conductive path from bond pad 706a to the respective touch electrodes coupled to conductive traces 708a and 708b.

In some examples, resistors 712a-h can be selected such that the resistance of the conductive paths from the bond pads 706a-b to the touch electrodes can be equal or substantially equal (within a threshold) for all channels included in the touch screen 700. In some examples, however, in order to make the resistance of the conductive path of every channel of touch screen 700 equal or substantially equal, the power consumption and/or bandwidth of some channels (e.g., channels with relatively short conductive traces, such as conductive traces 708d and 708e) may be unacceptable. In some examples, resistors 712a-h can be selected such that the difference in resistance between channels connecting adjacent pairs of touch electrodes is the same for all adjacent pairs of touch electrodes. Selecting resistors 712a-h to equalize the change in resistance for all adjacent pairs of touch electrodes can reduce the resistance needed for one or more channels of the touch screen 700, thereby improving bandwidth while also improving the accuracy of touch detection compared to the accuracy of touch detection of a touch screen without resistors 712a-h (e.g., touch screen 500).

As shown in FIG. 7, in some examples, the resistors 712a-h can be disposed in the border region 704 of the touch screen 700. Resistors 712a-h can include a transparent conductive material (e.g., ITO) that can be the same material or a different material from the transparent conductive material included in the touch electrodes of the touch screen 700. In some examples, the transparent conductive material of the touch electrodes is the same as the transparent conductive material of the resistors and the resistors are a part of each touch electrode. In some examples, the transparent conductive material can have a higher sheet resistance than the opaque conductive material (e.g., the material included in opaque conductive traces 708a-h). Thus, for example, resistors that include the transparent conductive material can have a smaller surface area and/or higher resistance than the resistors that include the opaque conductive material. As will be described in more detail below with reference to FIGS. 8A-9, in some examples, resistors 712a-h can have the same footprint or outer dimensions as one another and can be patterned in different ways such that the resistances of the various resistors 712*a-h* can be different from one another.

Figure 8A:
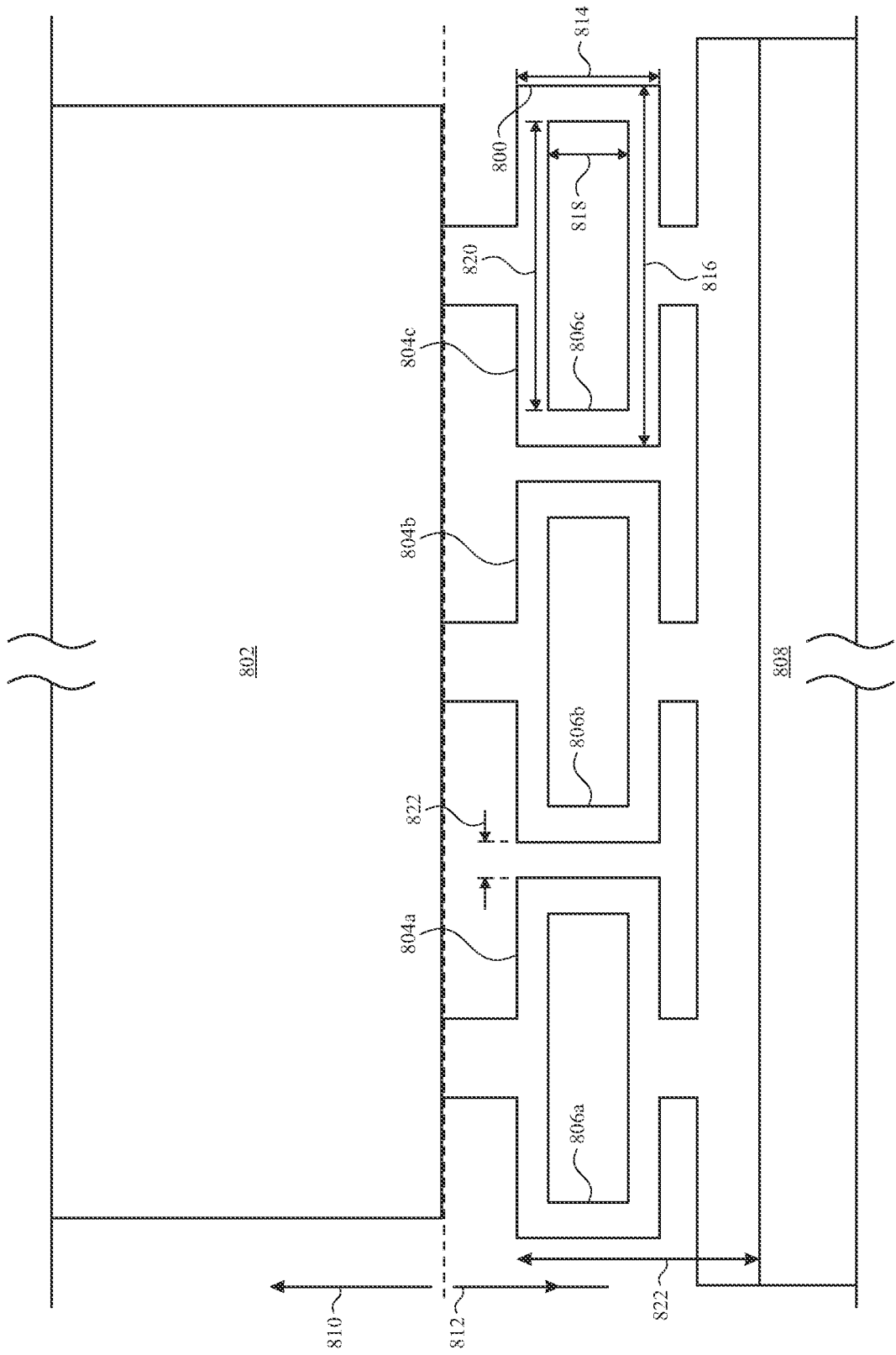
FIGS. 8A-8B illustrate an exemplary resistor according to some examples of the disclosure.
Figure 8B:
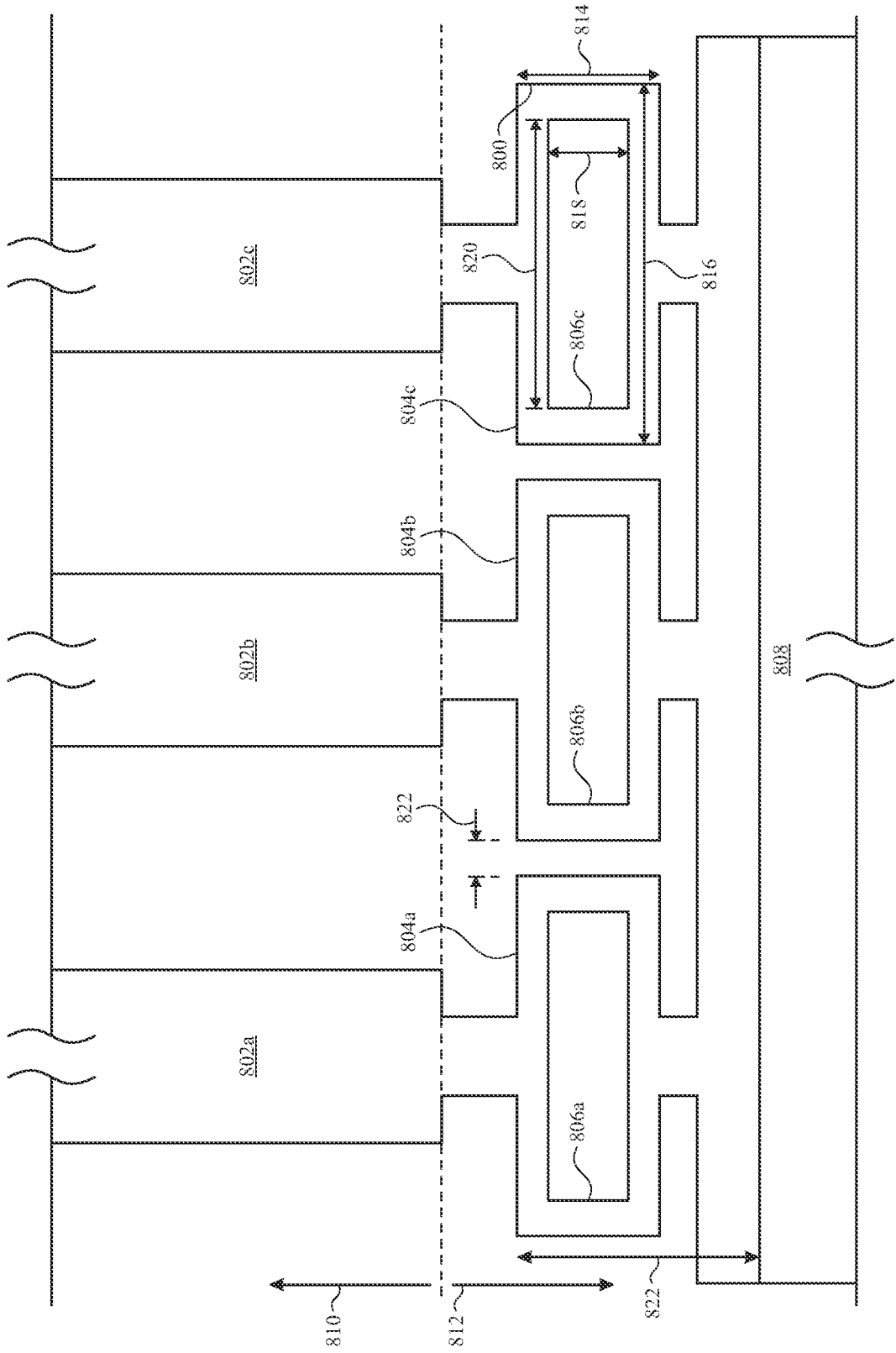

FIGS. 8A-8B illustrate an exemplary resistor 800 according to some examples of the disclosure. In some examples, resistor 800 can be coupled between a touch electrode 802 and an opaque conductive trace 808, for example. In some examples, the touch electrode 802 can be similar to any of the touch electrodes disclosed herein and opaque conductive trace 808 can be similar to the opaque conductive traces 508*a-h* and/or 708*a-h* described above with reference to FIG. 5 and FIG. 7, respectively. FIGS. 8A and 8B illustrate similar resistors 800 and different touch electrodes 802 and 802*a-c*.

In some examples, resistor 800 can include a transparent conductive material (e.g., ITO) that can be the same as or different from a transparent conductive material included in the touch electrode 802 to which the resistor 800 is coupled. The resistor 800 and opaque conductive trace 808 can be disposed in the border region 812 of a touch screen and the touch electrode 802 can be disposed in an active area 810 of the touch screen, for example.

In some examples, the resistor 800 can include three connected segments 804*a-c*. In some examples, the resistor 800 can include a different number of segments, such as one segment, two segments, or four or more segments. Each segment 804*a-c* can have a rectangular shape and a rectangular hole 806*a-c*, for example. In some examples, the segments 804*a-c* can include different outer shapes and/or different shaped holes (or multiple holes), such as outer shapes and/or holes shaped like squares, circles, triangles, polygons, etc. As shown in FIG. 8A, in some examples, each segment 804*a-c* of resistor 800 has the same shape an orientation. In some examples, the shape(s) and/or orientation(s) of the segments 804*a-c* of resistor 800 can be varied. Each segment 804*a-c* included in resistor 800 can have the same dimensions, including the same outer dimensions 816 and 814 and/or the same dimensions of the holes 806*a-c*, including inner dimensions 818 and 820, for example. Moreover, in some examples, the distance 822 between a respective part (e.g., the top) of each portion 804*a-c* of the resistor 800 and the conductive trace 808 can be the same for all segments 804*a-c* of resistor 800 and all resistors included in the panel. Moreover, in some examples, the distance between the touch electrode 802 and conductive trace 808 can be the same as the distance between the other touch electrodes and their respective conductive traces. In some examples, the dimensions 818 and 820 of the holes 806*a-c* can vary among the segments 806*a-c* of resistor 800. In some examples, the outer dimensions 814 and 816 of the segments 804*a-c* of resistor 800 can vary.

As shown in FIG. 8A, in some examples, the touch electrode 802 can include a continuous pattern that is coupled to each segment 804*a-c* of the resistor. As shown in FIG. 8B, in some examples, the touch electrode can include three patterned segments 802*a-c*. In some examples, the touch electrodes can have a different number of patterned segments, such as two segments or four or more segments. As shown in FIG. 8B, in some examples, each touch electrode segment 802*a-c* can be coupled to a resistor segment 804*a-c*. The touch electrode segments 802*a-c* can be connected through resistor 800 and otherwise completely separated from each other, for example. In some examples, the segments 802*a-c* can be coupled at locations within the active area 810 of the touch sensor panel. In some examples, the touch electrodes can include patterns that are different from the patterns illustrated in FIGS. 8A-8B without departing from the scope of the disclosure.

As described above with reference to FIGS. 6-7, in some examples, the resistors included in the touch screen can have different resistances from line to line in order to reduce the differences in resistances from line to line. In some examples, the resistance of resistors 800 can be altered by changing the inner dimensions 818 and 820 of the holes 806*a-c* of segments 804*a-c* and/or changing the width of the connection of the resistors to the touch electrodes 802 or 802*a-c* and/or the width of the connections to the opaque conductive trace 808, as will be described in more detail below with reference to FIG. 9.

Figure 9:
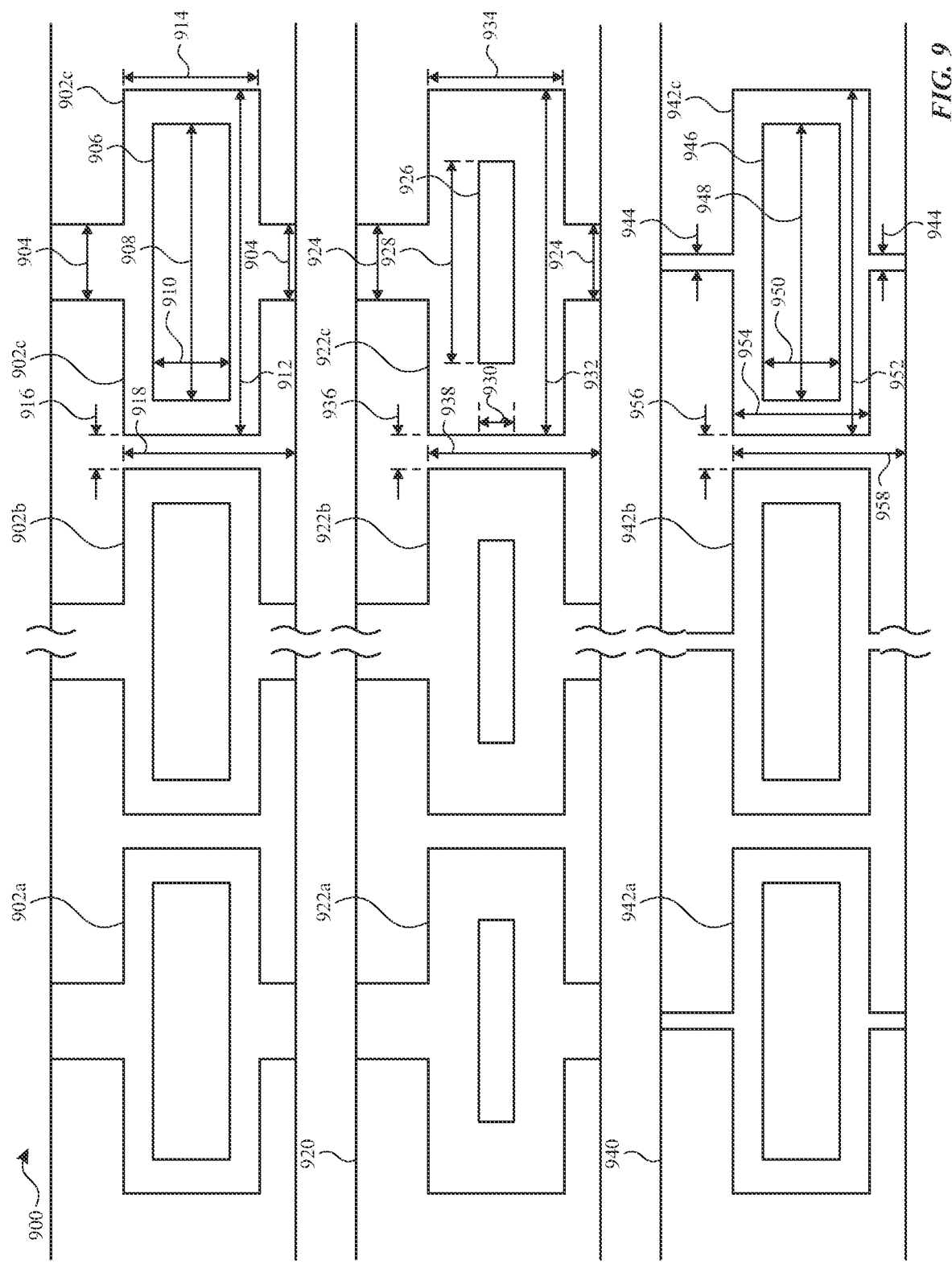
FIG. 9 illustrates exemplary resistors according to some examples of the disclosure.

FIG. 9 illustrates exemplary resistors 900, 920, and 940 according to some examples of the disclosure. Resistors 900, 920, and/or 940 can be included in a touch sensor panel, such as touch sensor panel 700 described above with reference to FIG. 7. As previously described, one or more dimensions of the resistors included in a touch sensor panel can vary from line to line in order to provide resistors with different resistances to reduce the variation in the total resistance of each line in the touch sensor panel.

In some examples, the dimensions of the holes of the segments of the resistors can vary from resistor to resistor. For example, the holes 906 of the segments 902*a-c* of resistor 900 can be larger than the holes 926 of the segments 922*a-c* of resistor 920. For example, the length 908 and height 910 of holes 906 of the segments 902*a-c* of the resistor 900 can be larger than the length 928 and height 930 of the holes 926 of the segments 922*a-c* of resistor 920. As a result, the resistance of resistor 900 can be greater than the resistance of resistor 920, for example, because the conductive pathways of resistor 900 can be narrower than the conductive pathways of resistor 920. In some examples, the length, or the height, or both the length and the height of the holes of the segments of the resistors can be varied from resistor to resistor to adjust the resistances of the resistors.

In some examples, the width of the connections of the resistors to the touch electrode and/or the opaque conductive traces can vary from resistor to resistor. For example, the width 904 of the connections of resistor 900 can be wider than the width 944 of the connections of resistor 940. In some examples, resistor 900 has a lower resistance than resistor 940 because the width 904 of the connections of resistor 900 can be wider than the width 944 of the connections of resistor 940. In some examples, both the width of the connections of the resistors and the size of the holes of the segments of the resistors can be varied to adjust the resistances of the resistors.

In some examples, although the resistors can have different connection widths and/or different sized holes, the outer dimensions of the segments of the resistors and the spaces between the segments of each resistor can be the same (or within a threshold of the same) for all of the resistors in the touch sensor panel. For example, the length 912 of the segments 902*a-c* of resistor 900, the length 932 of the segments 922*a-c* of resistor 920, and the length 952 of the segments 942*a-c* of resistor 940 can all be equal, substantially equal, or within a threshold of equal. As another example, the height 914 of the segments 902*a-c* of the resistor 900, the height 934 of the segments 922*a-c* of resistor 920, and the height 954 of the segments 942*a-c* of resistor 940 can all be equal, substantially equal, or within a threshold of equal. As another example, the distance 916 between the segments 902*a-c* of resistor 900, the distance 936 between the segments 922*a-c* of resistor 920, and the distance 956 between the segments 942*a-c* of resistor 940 can all be equal, substantially equal, or within a threshold of equal. Moreover, the distances between adjacent resistors can all be equal, substantially equal, or within a threshold of equal for all adjacent pairs of resistors included in the touch screen, for example. In some examples, the distances between adjacent resistors can be the same as or different from the distances (e.g., 916, 936, 956) between segments of each resistor. Additionally, in some examples, the distances (e.g., 918, 938, and 958) from a respective reference point (e.g., the top edge) of each resistor 900, 920, and 940 and the respective conductive traces to which each resistor is coupled can be the same, substantially the same, or within a threshold distance of the same. Moreover, in some examples, the distances between the respective touch electrodes coupled to each resistor 800, 820, and 840 and the respective conductive traces coupled to each resistor can be the same, substantially the same, or within a threshold of the same.

In some examples, the segments of each resistor to have the same or substantially the same (e.g., within a threshold) outer dimensions within each respective resistor and/or across all of the resistors in a single touch screen. If all of the resistors have outer dimensions that are equal, substantially equal, or within a threshold of equal, visual artifacts at the edge of the active area caused by the resistors can be less noticeable to the user and/or reduced, for example. In some example, if all of the resistors have outer dimensions that are equal, substantially equal, or within a threshold of equal, a laminated layer applied on top of the resistors in the touch screen can have a consistent, smooth, substantially smooth, or otherwise desired texture. In some examples, the spacing between the segments of a respective resistor and/or the spacing between each pair of adjacent resistors can be at least a minimum size and/or the holes of the segments of the resistors can each be a minimum size in order to facilitate lamination of the layer on top of the resistors.

It should be understood that the resistors of the touch screen can differ from the examples illustrated herein without departing from the scope of the disclosure. For example, rather than being rectangle-shaped, the resistors can have a different shape, such as square, circle, triangle, oval, or another shape. In some examples, additional elements can be disposed on the same material layer as the resistors, such as dummy electrodes, which can be disposed outside of the segments of the resistors or within the holes of the segments of the resistors. Moreover, in some examples, the resistor segments do not include holes. For example, the resistors and/or resistor segments can be serpentine-shaped and the number of turns, lengths, and/or widths of the conductive material of the resistors and/or resistor segments can vary from resistor to resistor to adjust the resistance of each resistor. As another example, the resistors or resistor segments can include two or more holes instead of one hole.

Therefore, according to the above, in some examples, an electronic device includes a plurality of touch electrodes including a first transparent conductive material, the touch electrodes disposed in an active area of a touch screen of the electronic device, wherein the active area includes a plurality of display pixels of the touch screen; a plurality of conductive traces including an opaque conductive material, the plurality of conductive traces coupled to a touch circuitry of the electronic device and disposed in a border region of the electronic device, the border region distinct from the active area; a plurality of resistors coupled between the plurality of touch electrodes and conductive traces, the resistors including a second transparent conductive material, the resistors disposed in the border region of the electronic device, each of the resistors having a same length and a same width, wherein: the plurality of resistors includes a first resistor and a second resistor, the first resistor has a first pattern and a first resistance, and the second resistor has a second pattern different from the first pattern and a second resistance different from the first resistance. Additionally or alternatively, in some examples, the first pattern of the first resistor includes a first area not including the second transparent conductive material of the first resistor surrounded by the second transparent conductive material of the first resistor. Additionally or alternatively, in some examples, the second pattern of the second resistor includes a second area not including the second transparent conductive material of the second resistor surrounded by the second transparent conductive material of the second resistor, wherein the second area has a different dimension than a dimension of the first area. Additionally or alternatively, in some examples, the first resistor includes a plurality of electrically coupled patterned resistor segments, and each of the plurality of resistor segments of the first resistor has a same pattern. Additionally or alternatively, in some examples, the plurality of resistor segments of the first resistor includes a first resistor segment, the first resistor segment including a first area not including the second transparent conductive material of the first resistor surrounded by the second transparent conductive material of the first resistor, the plurality of resistor segments of the first resistor includes a second resistor segment, the first resistor segment including a second area not including the second transparent conductive material of the first resistor surrounded by the second transparent conductive material of the first resistor, and dimensions of the first area and second area are the same. Additionally or alternatively, in some examples, a distance between each of the plurality of segments of the first resistor is the same as a distance between the first resistor and the second resistor. Additionally or alternatively, in some examples, the electronic device includes an opaque mask disposed in the border region, wherein the opaque mask obscures the plurality of conductive traces and at least a portion of the plurality of resistors. Additionally or alternatively, in some examples, the first resistor is coupled to a first touch electrode and a first conductive trace, the first touch electrode and the first conductive trace being a first distance apart, and the second resistor is coupled to a second touch electrode and second conductive trace, the second touch electrode and the second conductive trace being the first distance apart. Additionally or alternatively, in some examples, the first resistor is coupled to a first conductive trace of the plurality of conductive traces, the first conductive trace having a third resistance, the second resistor is coupled to a second conductive trace of the plurality of conductive traces, the second conductive trace having a fourth resistance, the first resistance is greater than the second resistance, and the fourth resistance is greater than the third resistance. Additionally or alternatively, in some examples, a difference between the third resistance and fourth resistance is greater than a difference between a respective combined resistance of the first resistance and the third resistance and a respective combined resistance of the second resistance and fourth resistance. Additionally or alternatively, in some examples, the electronic device further includes a bond pad disposed in the border region of the electronic device, wherein the conductive traces are coupled to the touch circuitry via the bond pad, and a distance between the bond pad and the first resistor and a distance between the bond pad and the second resistor are different, wherein: the distance between the bond pad and the first resistor is less than the distance between the bond pad and the second resistor, and the first resistance is greater than the second resistance.

Some examples of the disclosure are directed to electronic device, comprising: a plurality of touch electrodes including a transparent conductive material, the touch electrodes including first portions disposed in an active area of a touch screen of the electronic device, wherein the active area includes a plurality of display pixels of the touch screen; a plurality of conductive traces including an opaque conductive material, the plurality of conductive traces coupled to a touch circuitry of the electronic device and disposed in a border region of the electronic device, the border region distinct from the active area, the plurality of conductive traces coupled to the plurality of touch electrodes, wherein the plurality of touch electrodes include second portions disposed in the border region of the electronic device, each second portion of the resistors having a same length and a same width, a second portion of a first touch electrode has a first pattern and the first touch electrode has a first resistance, and a second portion of a second touch electrode has a second pattern different from the first pattern and the second touch electrode has a second resistance different from the first resistance. Additionally or alternatively, in some examples, the first pattern of the first touch electrode includes a first area not including the transparent conductive material of the first touch electrode surrounded by the transparent conductive material of the first touch electrode. Additionally or alternatively, in some examples, the second pattern of the second touch electrode includes a second area not including the transparent conductive material of the second touch electrode surrounded by the transparent conductive material of the second touch electrode, wherein the second area has a different dimension than a dimension of the first area. Additionally or alternatively, in some examples, the first touch electrodes includes a plurality of electrically coupled patterned segments, and each of the plurality of segments of the first touch electrode has a same pattern. Additionally or alternatively, in some examples, the plurality of segments of the first touch electrode includes a first segment, the first segment including a first area not including the transparent conductive material of the first touch electrode surrounded by the transparent conductive material of the first touch electrode, the plurality of segments of the first touch electrode includes a second segment, the first segment including a second area not including the transparent conductive material of the first touch electrode surrounded by the transparent conductive material of the first touch electrode, and dimensions of the first area and second area are the same. Additionally or alternatively, in some examples, the electronic device further includes an opaque mask disposed in the border region, wherein the opaque mask obscures the plurality of conductive traces and at least a portion of the second portions of the plurality of touch electrodes. Additionally or alternatively, in some examples, the first touch electrode is coupled to a first conductive trace of the plurality of conductive traces, the first conductive trace having a third resistance, the second touch electrode is coupled to a second conductive trace of the plurality of conductive traces, the second conductive trace having a fourth resistance, the first resistance is greater than the second resistance, and the fourth resistance is greater than the third resistance. Additionally or alternatively, in some examples, a difference between the third resistance and fourth resistance is greater than a difference between a respective combined resistance of the first resistance and the third resistance and a respective combined resistance of the second resistance and fourth resistance. Additionally or alternatively, in some examples, the electronic device further includes a bond pad disposed in the border region of the electronic device, wherein the conductive traces are coupled to the touch circuitry via the bond pad, and a distance between the bond pad and the first touch electrode and a distance between the bond pad and the second touch electrode are different, wherein: the distance between the bond pad and the first touch electrode is less than the distance between the bond pad and the second touch electrode, and the first resistance is greater than the second resistance.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

The invention claimed is:

1. An electronic device comprising:
a plurality of touch electrodes including a first transparent conductive material, the touch electrodes disposed in an active area of a touch screen of the electronic device, wherein the active area includes a plurality of display pixels of the touch screen;
a plurality of conductive traces including an opaque conductive material, the plurality of conductive traces coupled to a touch circuitry of the electronic device and disposed in a border region of the electronic device, the border region distinct from the active area; and
a plurality of resistors coupled between the plurality of touch electrodes and the plurality of conductive traces, the plurality of resistors including a second transparent conductive material, the plurality of resistors disposed in the border region of the electronic device, wherein:
the plurality of resistors includes a first resistor and a second resistor;
the first resistor has a portion with a first closed-figure geometry and the first resistor has a first resistance; and
the second resistor has a portion with a second closed-figure geometry different from the first closed-figure geometry and has a second resistance different from the first resistance.

2. The electronic device of claim 1, wherein the portion with the first closed-figure geometry and the portion with the second closed-figure geometry have a same outer length and a same outer width.

3. The electronic device of claim 2, wherein the portion with the first closed-figure geometry and the portion with the second closed-figure geometry have a different inner length or a different inner width.

4. The electronic device of claim 1, wherein the portion with the first closed-figure geometry and the portion with the second closed-figure geometry have same outer dimensions and different inner dimensions.

5. The electronic device of claim 1, wherein the first resistor includes a plurality of patterned resistor segments, each of the patterned resistor segments including the first closed-figure geometry.

6. The electronic device of claim 5, wherein each of the plurality of patterned resistor segments of the first resistor has a same pattern with same dimensions.

7. The electronic device of claim 5, wherein:
the first resistor includes a first plurality of connection segments, each of the first plurality of connection segments between one of the plurality of patterned resistor segments and a first touch electrode of the plurality of touch electrodes; and a connection segment coupled between the plurality of patterned resistor segments and a first conductive trace of the plurality of conductive traces.

8. The electronic device of claim 7, wherein dimensions of each of the first plurality of connection segments are the same.

9. The electronic device of claim 7, wherein spacing between adjacent pairs of the first plurality of connection segments are equal and spacing between two adjacent pairs of the plurality of patterned resistor segments are equal.

10. The electronic device of claim 1, further comprising:
an opaque mask disposed in the border region, wherein the opaque mask obscures the plurality of conductive traces and at least a portion of the plurality of resistors.

11. The electronic device of claim 1, further comprising:
touch sensing circuitry;
wherein a first total resistance between a first touch electrode of the plurality of touch electrodes and the touch sensing circuitry is within a threshold amount of a second total resistance between a second adjacent touch electrode of the plurality of touch electrodes and the touch sensing circuitry.

12. The electronic device of claim 1, wherein the first closed-figure geometry or the second closed-figure geometry comprises a polygonal shape having a polygonal hole.

13. The electronic device of claim 12, wherein the polygonal shape is a rectangle.

14. The electronic device of claim 1, wherein the first transparent conductive material and the second transparent conductive material include indium tin oxide and the opaque conductive material includes copper.

15. An electronic device comprising:
a plurality of touch electrodes including a first transparent conductive material, the touch electrodes disposed in an active area of a touch screen of the electronic device, wherein the active area includes a plurality of display pixels of the touch screen;
a plurality of conductive traces including an opaque conductive material, the plurality of conductive traces coupled to a touch circuitry of the electronic device and disposed in a border region of the electronic device, the border region distinct from the active area; and
a plurality of resistors coupled between the plurality of touch electrodes and the plurality of conductive traces, the plurality of resistors including a second transparent conductive material, the plurality of resistors disposed in the border region of the electronic device, wherein:
the plurality of resistors includes a first resistor having a first resistance and a second resistor having a second resistance different from the first resistance;
the first resistor includes a first plurality of resistive segments, each of the first plurality of resistive segments having a closed-figure shape;
the second resistor includes a second plurality of resistive segments, each of the second plurality of resistive segments having the closed-figure shape; and
a first resistive segment of the first plurality of resistive segments and a first resistive segment of the second plurality of resistive segments have same outer dimensions and different inner dimensions.

16. The electronic device of claim 15, wherein:
the first resistor is coupled between a first touch electrode of the plurality of touch electrodes and a first conductive trace of the plurality of conductive traces such that first terminals of the first plurality of resistive segments couple separately to the first touch electrode and second terminals of the first plurality of resistive segments couple together to the first conductive trace.

17. The electronic device of claim 16, wherein the first touch electrode includes a plurality of touch electrode segments, wherein each of the first terminals of the first plurality of resistive segments couples to one of the plurality of touch electrode segments.

18. The electronic device of claim 15, wherein each of the first plurality of resistive segments having a closed-figure shape has same outer dimensions and same inner dimensions.

19. The electronic device of claim 15, wherein each of the first plurality of resistive segments having a closed-figure shape has same outer dimensions and different inner dimensions.

20. The electronic device of claim 15, wherein a distance between the first plurality of resistive segments is the same as a distance between the second plurality of resistive segments.

* * * * *